United States Patent
Blin

(10) Patent No.: US 10,103,495 B2
(45) Date of Patent: Oct. 16, 2018

(54) METHODS AND APPARATUS FOR ADAPTIVE GROUNDING AND NOISE MITIGATION IN MIXED-SIGNAL DEVICES

(71) Applicant: SKYWORKS SOLUTIONS, INC., Woburn, MA (US)

(72) Inventor: Guillaume Alexandre Blin, Carlisle, MA (US)

(73) Assignee: SKYWORKS SOLUTIONS, INC., Woburn, MA (US)

(*) Notice: Subject to any disclaimer, the term of this patent is extended or adjusted under 35 U.S.C. 154(b) by 0 days.

(21) Appl. No.: 15/672,189

(22) Filed: Aug. 8, 2017

(65) Prior Publication Data
US 2018/0062321 A1    Mar. 1, 2018

Related U.S. Application Data

(60) Provisional application No. 62/462,064, filed on Feb. 22, 2017, provisional application No. 62/382,373, filed on Sep. 1, 2016.

(51) Int. Cl.
| | |
|---|---|
| *H01R 4/66* | (2006.01) |
| *H01R 13/6471* | (2011.01) |
| *H05K 1/02* | (2006.01) |
| *H01L 23/12* | (2006.01) |
| *H01P 1/00* | (2006.01) |

(52) U.S. Cl.
CPC ......... *H01R 13/6471* (2013.01); *H01L 23/12* (2013.01); *H01P 1/00* (2013.01); *H05K 1/0215* (2013.01); *H05K 1/0227* (2013.01); *H05K 1/0228* (2013.01)

(58) Field of Classification Search
CPC ............ H01R 13/6471; H03H 9/0542; H05K 1/0227; H05K 1/0228
See application file for complete search history.

(56) References Cited

U.S. PATENT DOCUMENTS

| | | | | |
|---|---|---|---|---|
| 6,754,471 | B1* | 6/2004 | Vakilian | H03H 9/0542 438/108 |
| 9,780,663 | B2* | 10/2017 | Lidsky | H02M 3/158 |
| 9,834,209 | B2* | 12/2017 | Stettner | B60W 30/08 |
| 2008/0088510 | A1* | 4/2008 | Murata | H01Q 3/24 343/700 MS |

* cited by examiner

*Primary Examiner* — Jean F Duverne
(74) *Attorney, Agent, or Firm* — Lando & Anastasi, LLP

(57) ABSTRACT

Methods and apparatus for providing adaptive grounding in mixed-signal electronic dies, circuits, modules, or other devices. In one example a module in which adaptive grounding is implemented includes a substrate having disposed thereon a plurality of signal contacts and a ground connection, and a mixed-signal die disposed on the substrate and including a signal section and a control section, the signal section having a plurality of radio frequency components each connected to a respective one of the plurality of signal contacts on the substrate by a corresponding signal connector, and the control section having at least two ground paths that selectively connect the control section to the ground connection on the substrate and which are physically spaced apart from one another, the mixed-signal die further including at least two switches, each operable to selectively connect one of the ground paths to the ground connection.

18 Claims, 14 Drawing Sheets

METHODS AND APPARATUS FOR ADAPTIVE GROUNDING AND NOISE MITIGATION IN MIXED-SIGNAL DEVICES

CROSS-REFERENCE TO RELATED APPLICATIONS

This application claims the benefit under 35 U.S.C. § 119(e) of U.S. Provisional Application No. 62/382,373 titled "METHODS AND APPARATUS FOR ADAPTIVE GROUNDING AND NOISE MITIGATION IN MIXED-SIGNAL DEVICES" and filed on Sep. 1, 2016, and of U.S. Provisional Application No. 62/462,064 titled "METHODS AND APPARATUS FOR ADAPTIVE GROUNDING AND NOISE MITIGATION IN MIXED-SIGNAL DEVICES" and filed on Feb. 22, 2017, both of which are incorporated herein by reference in their entireties for all purposes.

BACKGROUND

Various communications systems include modules or devices that have both a radio frequency (RF) signal portion and an analog control portion. For example, FIG. 1 is a block diagram showing a schematic representation of device 100 that includes an RF section 110 and an analog control section 120, also referred to as an energy management section (EM core). The RF section 102 may include one or more RF components, such as switches, amplifiers, etc., and associated circuitry for transferring RF signals between various RF signal contacts 112. The analog control section 120 includes a ground contact 122 for connecting the analog control section to an analog ground, and a power contact 124 for connection to a power supply. The contacts 112, 122, and 124 can be wirebond pads, solder bumps, or any other type of electrical connection.

Unwanted signal coupling can frequently occur between the RF section 110 and the analog control section 120, which can create signal harmonics and other noise that degrades RF performance. The effect is generally most detrimental to RF devices connected to those contacts 112 closest to the analog control section 110. Conventionally, shielding is used in an attempt to prevent such signal coupling, but it is usually accepted that the RF devices closest to the analog control section 120 will have degraded performance.

SUMMARY OF INVENTION

Aspects and embodiments are directed to methods and structures that mitigate unwanted signal coupling between different sections of a mixed-signal die, for example, between the RF and analog/digital control sections, through the use of adaptive grounding and selective connection techniques, as discussed in detail below.

According to one embodiment a module comprises a substrate having disposed thereon a plurality of signal contacts and a ground connection, and a mixed-signal die disposed on the substrate and including a signal section and a control section, the signal section having a plurality of switching circuits each connected to a respective one of the plurality of signal contacts on the substrate by a corresponding signal connector, and the control section having at least two ground paths that selectively connect the control section to the ground connection on the substrate, the at least two ground paths being physically spaced apart from one another, the mixed-signal die further including at least two switches, each operable to selectively connect one of the at least two ground paths to the ground connection.

In one example of the module each corresponding signal connector includes at least one wirebond. In other examples of the module each corresponding signal connector includes a solder bump, conductive trace, or other type of wiring/connection medium.

In one example of the module the at least two switches are configured to operate substantially simultaneously and oppositely to alternately connect one of the at least two ground paths to the ground connection. The control section may be configured to provide control signals to actuate the at least two switches.

In one example of the signal section is a radio frequency signal section, and the signal switching circuits are radio frequency switching circuits each including at least one transistor.

Another embodiment is directed to a wireless device comprise an example of the module configured as an antenna switching module, a transceiver connected to the signal section of the mixed-signal die via at least one transmission path and a corresponding at least one first signal contact of the plurality of signal contacts on the substrate of the module, and an antenna connected to at least one second signal contact of the plurality of signal contacts on the substrate of the module.

In one example the wireless device further comprises at least one power amplifier connected in the at least one transmission path between the transceiver and the corresponding at least one first signal contact. The transceiver may be further connected to the signal section of the mixed-signal die via at least one receive path and a corresponding at least one third signal contact of the plurality of signal contacts on the substrate of the module.

According to another embodiment a module comprises a substrate having disposed thereon a plurality of radio frequency (RF) signal contacts and a ground connection, and a mixed-signal die disposed on the substrate and including an RF section and a control section, the RF section having a plurality of RF switching circuits each connected to a respective one of the plurality of RF signal contacts on the substrate by a corresponding signal connector, and the control section having at least two ground paths that selectively connect the control section to the ground connection on the substrate, the at least two ground paths being physically spaced apart from one another, the mixed-signal die further including at least two switches, each operable to selectively connect one of the at least two ground paths to the ground connection.

In one example of the module each corresponding connector includes at least one wirebond. In other examples of the module each corresponding signal connector includes a solder bump, conductive trace, or other type of wiring/connection medium.

In one example the at least two switches are configured to operate substantially simultaneously and oppositely to alternately connect one of the at least two ground paths to the ground connection. In another example the control section is configured to provide control signals to actuate the at least two switches.

Another embodiment is directed to a wireless device comprising an example of the module configured as an antenna switching module, a transceiver connected to the RF section of the mixed-signal die via at least one transmission path and a corresponding at least one first RF signal contact of the plurality of RF signal contacts on the substrate of the module, and an antenna, the module being configured to switchably connect the transceiver to the antenna using at least one of the plurality of RF switching circuits. The wireless device may further comprise at least one power amplifier connected in the at least one transmission path between the transceiver and the corresponding at least one first RF signal contact. The transceiver may be further connected to the RF section of the mixed-signal die via at least one receive path and a corresponding at least one second signal contact of the plurality of RF signal contacts on the substrate of the module.

According to another embodiment a mixed-signal electronic device comprises an on-die radio frequency (RF) section including first and second RF components and corresponding first and second signal connectors for respectively connecting the first and second RF components to off-die RF circuitry, an on-die control section coupled to the on-die RF section and including grounding wiring, a first grounding connector disposed physically closer to the first signal connector than to the second signal connector, the first grounding connector being electrically connected to an off-die ground, a second grounding connector disposed physically closer to the second signal connector than to the first signal connector, the second grounding connector being electrically connected to the off-die ground, a first switch operable to selectively connect the grounding wiring of the control section to the first grounding connector, and a second switch operable to selectively connect the grounding wiring of the control section to the second grounding connector.

In one example of the mixed-signal electronic device the first and second signal connectors and the first and second grounding connectors are wirebonds. In another example the first and second switches are configured to be substantially simultaneously and oppositely operable to connect one of the first and second grounding connectors to the grounding wiring at any given time. In another example the on-die control section is configured to provide control signals to actuate the first and second switches. In one example the RF components are RF switching circuits. In another example the RF components are RF amplifiers.

Another embodiment is directed to a module comprising an example of the electronic device.

According to one embodiment a module comprises a substrate having disposed thereon a plurality of signal contacts and a ground connection, and a mixed-signal die disposed on the substrate and including a signal section and a control section, the signal section having a plurality of radio frequency components each connected to a respective one of the plurality of signal contacts on the substrate by a corresponding signal connector, and the control section having at least two ground paths that selectively connect the control section to the ground connection on the substrate, the at least two ground paths being physically spaced apart from one another, the mixed-signal die further including at least two switches, each operable to selectively connect one of the at least two ground paths to the ground connection.

In one example of the module the radio frequency components are radio frequency switching circuits. In another example of the module the radio frequency components are radio frequency amplifiers, such as power amplifiers or low noise amplifiers.

Another embodiment is directed to a method of adaptive grounding in a mixed-signal electronic device including a plurality of radio frequency (RF) components, a control section, and a plurality of grounding connectors. In one embodiment the method comprises determining whether more than one of the plurality of RF components is active, responsive to determining that only one of the plurality of RF components is active, electrically connecting the control section to one grounding connector disposed physically farthest from the active one of the plurality of RF components among the plurality of grounding connectors, responsive to determining that at least two RF components of the plurality of RF components are active, determining whether the one grounding connector is disposed physically farthest from both of the at least two active RF components, and responsive to determining that the one grounding connector is disposed physically farthest from both of the at least two active RF components, connecting the one grounding connector to the control section.

In one example the method can be applied to a mixed-signal electronic device in which the RF components are RF switching circuits. In another example the method can be applied to a mixed-signal electronic device in which the RF components are RF amplifiers, such as power amplifiers or low noise amplifiers.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

As discussed above, in many devices unwanted signal coupling can occur between different sections of a mixed-signal die or other electronic device. For example, unwanted signal coupling can occur between the radio frequency (RF) section of a die and the analog or digital control section (herein referred to as the control section), thereby introducing noise into the RF section and degrading performance.

Figure 1:
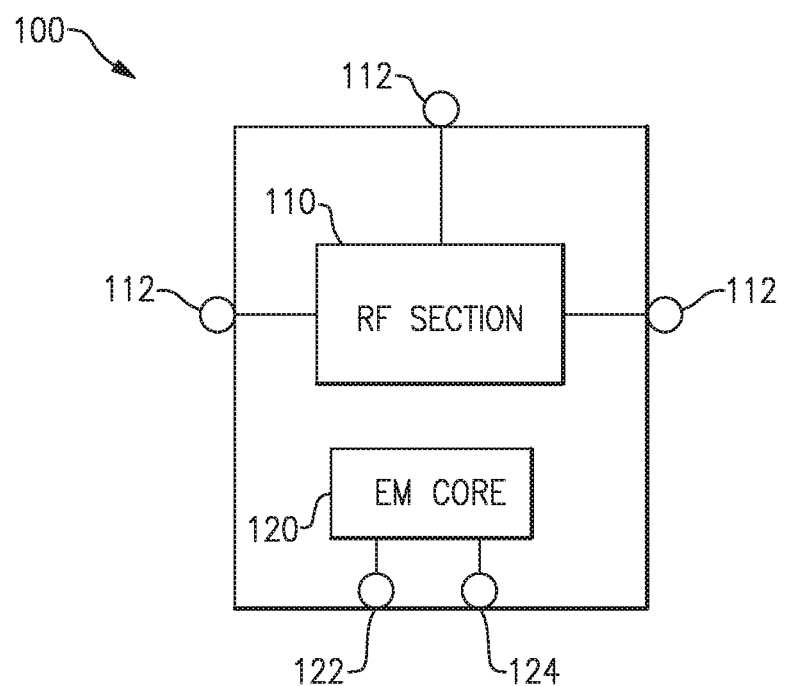
FIG. 1 is a block diagram of one example of a mixed-signal device including an RF section and an analog control section.
Figure 2:
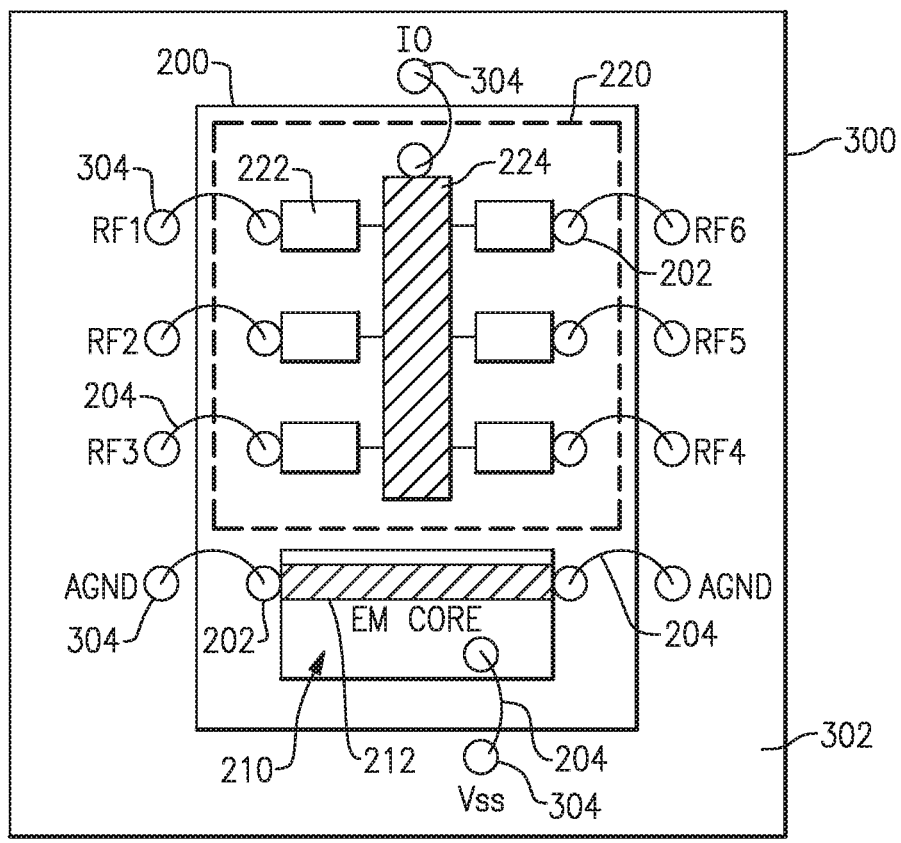
FIG. 2 is a schematic diagram of one example of a module including a mixed-signal die having an RF section and a control section according to aspects of the present invention.

For example, FIG. 2 illustrates a module 300 including a mixed-signal die 200 that has a control section 210 and an RF section 220. The module 300 includes a substrate 302 on which the mixed-signal die 200 is mounted. In some embodiments, the substrate 302 can include a laminate substrate. The module 300 may include additional dies or circuitry not shown in FIG. 2, which can be mounted on or formed on the substrate 302. The mixed-signal die 200 includes a plurality of on-die contacts 202 that are connected to the various components and wiring of the die. The on-die contacts 202 are connected to module contacts 304 on the module substrate 304 by electrical connectors 204. The on-die contacts 202 and module contacts 304 can be wirebond pads, solder bumps, or any other type of electrical connections that allow signals or power to be transferred between the components of the die 200 and circuitry or interfaces on the module 300. The electrical connectors 204 are shown in FIG. 2 as wirebonds, but may be implemented as other types of electrical connectors, such as solder bumps, for example. In some embodiments, the module 300 can also include one or more packaging structures (not shown) to, for example, provide protection and facilitate easier handling of the module 300. Such a packaging structure can include an overmold formed over the substrate 302 and dimensioned to substantially encapsulate the various dies and components thereon.

The control section 210 of the mixed-signal die 200 includes grounding wiring 212, schematically represented in FIG. 2 by a conductive trace, but which may include one or more traces, wires, or the like. The grounding wiring 212 is connected to analog (or non-RF) ground (AGND) on the module 300 by respective on-die contacts 202, module contacts 304, and wirebonds 204, as shown in FIG. 2. The control section 210 is further connected to a supply voltage (Vss).

The RF section 220 of the mixed-signal die 200 includes a plurality of RF components 222 and RF wiring 224. The RF components are connected to certain module contacts 304 that act as RF signal contacts (labeled RF1 to RF6 in the example illustrated in FIG. 2) or RF input/output contacts (labeled I/O in the example illustrated in FIG. 2) via respective on-die contacts 202 and electrical connectors 204, as shown. The RF components 222 may be RF switches, amplifiers, or other components, as discussed further below. In the example illustrated in FIG. 2, the RF section 220 is shown to include six RF components 222, each connected to a respective RF signal contact. However, those skilled in the art will appreciate that embodiments are not limited to this configuration. The RF section 220 may include more or fewer than six RF components 222, any of which may be connected to one or more module contacts 304.

It is to be appreciated that although the following description may refer primarily to RF signals and circuitry, aspects, features, and advantages of the apparatus, techniques, and methods disclosed herein are not limited in application to the RF portion of the electromagnetic spectrum and may apply equally to signals and circuitry operating in other frequency bands including, but not limited to, microwave, millimeter-wave, UHF, and others.

As discussed above, in certain circumstances during operation of the RF components 222 unwanted signal coupling can occur between the RF section 220 and the control section 210. This phenomenon is explained further with reference to FIG. 3, which illustrates one example of the module 300 in which the RF components 222 are RF switching circuits and the electrical connectors 204 are wirebonds.

Figure 3:
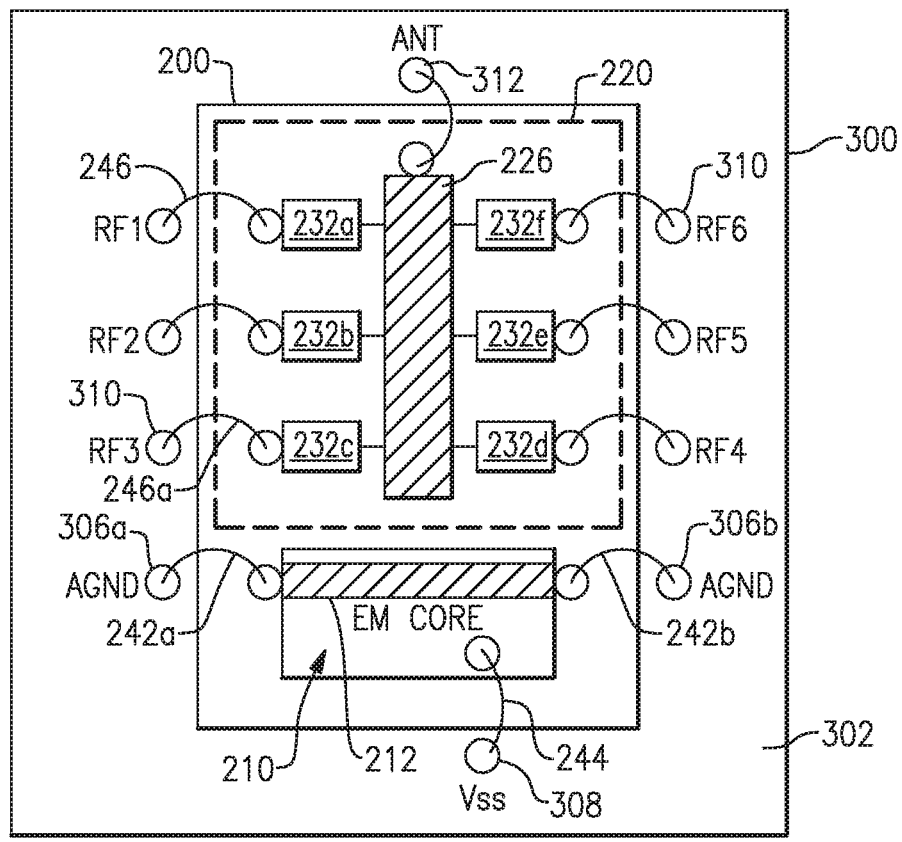
FIG. 3 is a schematic diagram of one example of the module of FIG. 2 in which the RF section of the mixed-signal die includes RF switching components, and having adaptive grounding features according to aspects of the present invention.

Referring to FIG. 3, in one embodiment the grounding wiring 212 of the control section 210 is connected to a first ground contact 306a on the module substrate 302 by a first wirebond 242a, and to a second ground contact 306b by a second wirebond 242b. The control section 210 is further connected to a supply contact (Vss) 308 by another wirebond 244. In one embodiment, the RF section 220 of the die 200 includes a plurality of RF switching circuits 232a-f that are connected to a corresponding plurality of RF signal contacts 310 (RF1-RF6) on the module 300 by a corresponding plurality of wirebonds 246. In the illustrated example, the RF input/output signal contact (I/O in FIG. 2) is an antenna contact 312 to which an external antenna (not shown) can be connected. Accordingly, the RF wiring 224 of FIG. 2 includes an antenna bar 226 in this example. The antenna bar 226 can be a relatively wide metal trace. Such a die 200 or module 300 may be an RF switch-plexer, for example, that selectively couples one or more of the RF signal contacts 310 to the antenna contact 312 such that the RF section 220 transfers RF signals between any one or more of the RF signal contacts and an external antenna (not shown) connected to the antenna contact 312. Similar embodiments include an RF switch-plexer that connects one or more of the RF signal contacts 310 to an input/output contact 304 that is not necessarily connected to an antenna. In the illustrated example the die 200 and module 300 include six RF signal contacts 310 (RF1 to RF6) and six associated RF signal switching circuits 232a-f; however, other examples may include a different number of RF signal contacts and switching circuits, and embodiments of the invention are not limited to dies/modules including six RF signal contacts and switching circuits. The RF switching circuits 232a-f may each include one or more RF transistors, for example.

The control section 210 provides control signals to operate the RF section 220 to enable the desired transfer of the RF signals between the antenna contact 312 and a selected RF signal contact 310. Typically, only one of the RF signal contacts 310 may be active, and its associated RF switching circuit "ON", at any given time, although in certain embodiments (e.g., for multi-band communications or simultaneous transmission and reception) two or more RF signal contacts can be active at the same time.

Figure 4:
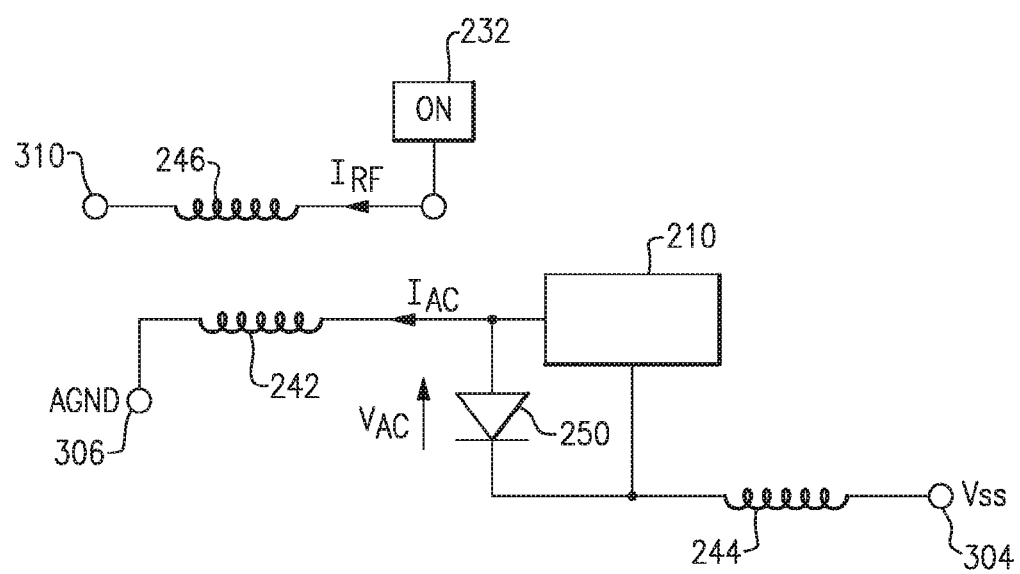
FIG. 4 is a schematic diagram illustrating inductive coupling of an RF signal onto the control section of a device and the resulting generation of induced signals in the control section.

At RF frequencies, the wirebonds 242, 244, 246 as well as the antenna bar 226, can act as inductive and/or capacitive couplers. Thus, referring to FIG. 4, an RF signal ($I_{RF}$) flowing from an RF switching circuit 232 that is in the ON state via one of the wirebonds 246 to a corresponding RF signal contact 310 can induce an AC current ($I_{AC}$) in the control section 210 through inductive or capacitive coupling between the wirebond 246 and a wirebond 242 connecting the control section 210 to analog ground (AGND). The control section 210 typically includes electro-static devices (ESDs) for electromagnetic suppression/protection, such as one or more ESD diodes (represented in FIG. 4 by diode 250). The induced AC current ($I_{AC}$) in the control section 210 can in turn induce an AC voltage ($V_{AC}$) across devices in the control section 210, such as across the ESD diode 250, as shown in FIG. 4. This induced AC voltage across non-linear devices, such as the ESD diode 250, leads to the generation of harmonics by rectification of the coupled RF signal. As a result of the rectification of the harmonics across the ESD diode 250, a spurious DC current can be generated in the control section 210, which can adversely affect the supply voltage (Vss), along with control voltages and data interfaces, for example, in the control section 210. In addition, the generated harmonics will couple back across the wirebonds 242, 246 into the RF signal path, thereby introducing harmonics into the RF circuitry and degrading performance. Similarly, any noise created in the control section 210, such as the high frequency content of digital or switching devices, can couple into the RF section 220 and introduce noise/perturbations degrading the RF performance. Also, any RF coupling to the analog/control section 210 (though these coupling paths) can mix with other signals present in the analog section such as, for example, oscillator signals, DC/DC converter switching signals, etc., creating intermodulation or mixing products that couple back to the RF section 220.

The inductive or capacitive coupling between the wirebonds is strongest between wirebonds that are in close physical proximity, such as between wirebond 242a and the wirebond 246a connected to signal contact RF3 in FIG. 3, for example. Accordingly, aspects and embodiments are directed to reducing such coupling and thereby improving performance by providing the control section 210 with at least two paths to analog ground that are physically spaced apart from one another (e.g., wirebonds 242a and 242b in the example shown in FIG. 3), and by selectively connecting the path that is farthest from an active RF signal path at any given time while disconnecting the other path(s) so as to reduce RF signal coupling onto the analog ground.

Figure 5:
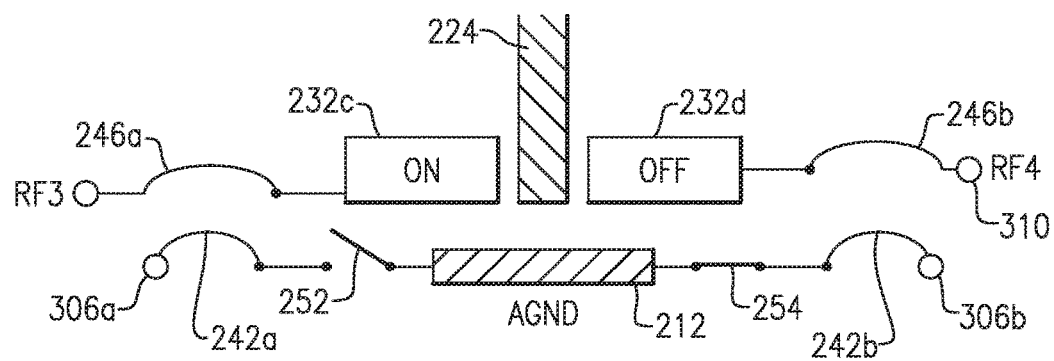
FIG. 5 is a schematic diagram of a portion of one example of a device including adaptive grounding according to aspects of the present invention.

Referring to FIG. 5, in one embodiment a pair of switches 252, 254 are used to selectively ground the control section 210. In this example, a first switch 252 is placed in series between the grounding wiring 212 of the control section 210 and the first wirebond 242a connected to the first analog ground contact 306a, and a second switch 254 is placed in series between the grounding wiring 212 of the control section 210 and the second wirebond 242b connected to the second analog ground contact 306b. The switches 252 and 254 may each include one or more switching devices, such as one or more transistors, for example. The switches 252, 254 can be alternately closed depending on which of the wirebonds 246 connecting the RF signal contacts 310 to the RF switching circuits 232 is/are carrying an RF signal at any given time. Typically, only one RF switching circuit 232 is ON (i.e., active and carrying an RF signal) at a time. For example, as shown in FIG. 5, if RF signal contact RF3 is active, and switching circuit 232c is ON, switch 252 can be open, such that any coupling of the RF signal from wirebond 246a into wirebond 242a does not have a connection by which to travel into the control section 210. In this case, the analog ground connection for the control section 210 is made by closing the switch 254, as shown, to connect the grounding wiring 212 to the wirebond 242b. Wirebond 242b is in close proximity to wirebond 246b connecting the RF signal contact RF4 to RF switching circuit 232f; however, as shown RF switching circuit 232f is OFF and therefore there is little or no signal coupling between wirebonds 242b and 246b.

As discussed above, in some operations only one RF signal contact 310 and corresponding RF component 222 is active (i.e., carrying an RF signal) at a time. Additionally, as the control section 210 is responsible for operating the RF section 220 to correctly couple the input/output contact (e.g., antenna contact 312) to the active RF signal contact 310, the control section 210 has knowledge of which RF component 222 is active at a particular time. Accordingly, with this knowledge, the control section 210 can provide appropriate actuation signals to control the switches 252, 254 to connect the analog ground contact 306a or 306b farther from the active RF signal contact 310 and disconnect the analog ground contact closer to the active RF signal contact. Even in circumstances where more than one RF signal contact 310 is active at a given time, by design choice typically opposing signal contacts, such as RF3 and RF4, for example, are not active simultaneously. Therefore, in the embodiments of FIGS. 3 and 5, for example, when RF3 is active and associated RF switching circuit 232c is ON, the analog ground contact 306b can be connected by closing switch 254 (as shown in FIG. 5) because no RF signal is available from the OFF RF switching circuit 232f to couple into wirebond 242b. Similarly, when RF4 is active and RF switching circuit 232f is ON, switch 254 can be opened and switch 252 closed to connect the grounding wiring 212 to the analog ground contact 306a. Further, referring to both FIGS. 3 and 5, switch 252 can be closed and switch 254 opened when RF signal contacts RF5 or RF6 are active, and switch 254 can be closed and switch 252 opened when RF signal contacts RF1 or RF2 are active. In this manner, the analog ground path (combination of 306a and 242a or combination of 306b and 242b) farthest from an active RF signal contact 310, and therefore least susceptible to inductive coupling of the RF signal, can be used to ground the control section 210. Thus, at given time a grounding path is provided for the control section 210 and the potential for unwanted RF signal coupling onto the grounding path can be minimized.

Although it may be unlikely, in certain circumstances two opposing RF signal contacts (e.g., RF3 and RF4) can be active simultaneously. In this case, both switches 252, 254 can be closed such that the grounding wiring 212 uses both grounding paths through wirebonds 242a and 242b, or a selection can be made as to which switch should be open and which closed. For example, a determination can be made as to the signal strength at each of the active RF signal contacts 310 and associated RF components 222, and the grounding path closer to the weaker RF signal can be used.

In the example of FIGS. 3 and 5, the RF components 222 are RF switching circuits; however, as discussed above, the adaptive grounding techniques disclosed herein can be applied to other RF components not limited to RF switching circuits. For example, FIGS. 6 and 7 illustrate examples of the module 300 in which the RF section 220 of the mixed-signal die 200 includes a plurality of amplifiers.

Figure 6:
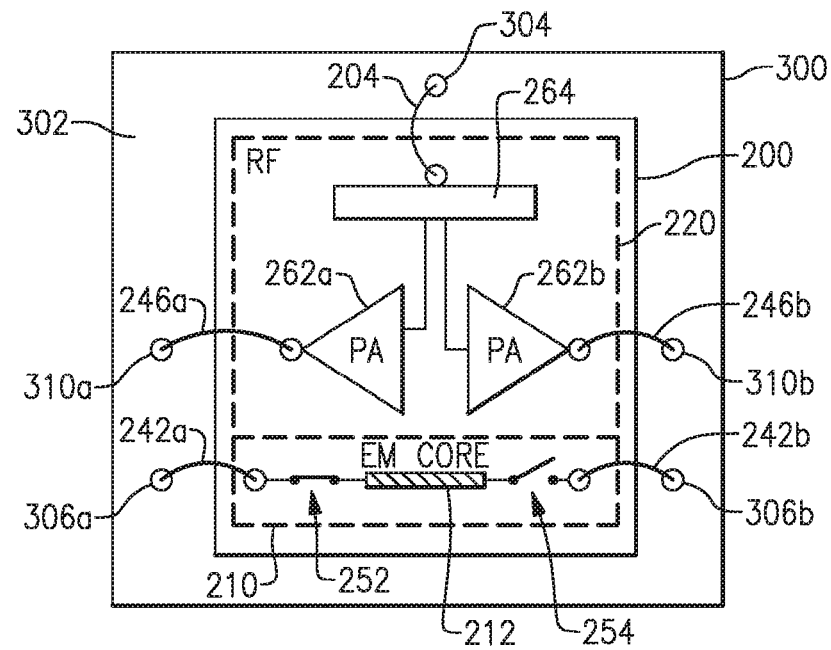
FIG. 6 is a schematic diagram of another example of a module including a mixed-signal die and having adaptive grounding features according to aspects of the present invention.
Figure 7:
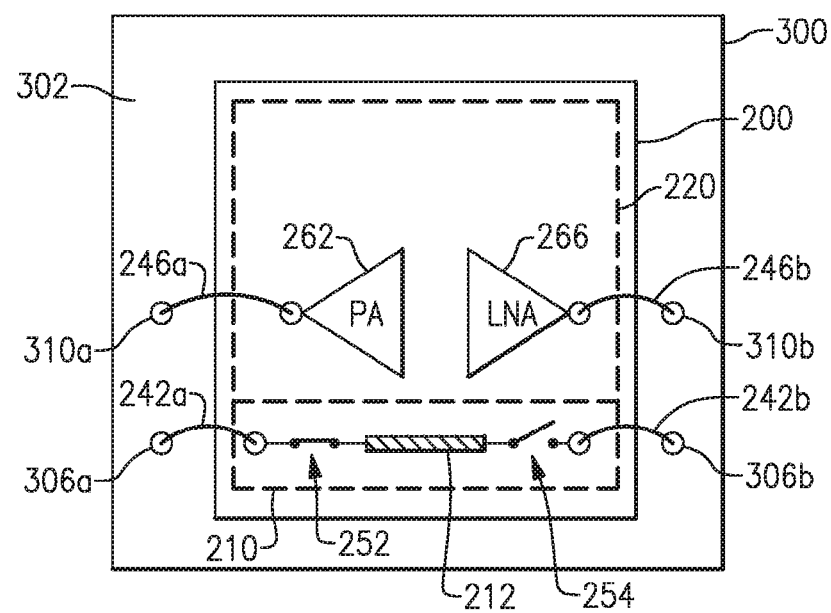
FIG. 7 is a schematic diagram of another example of a module including a mixed-signal die and having adaptive grounding features according to aspects of the present invention.

Referring to FIG. 6, according to one embodiment the RF section 220 of the mixed-signal die 200 includes a first power amplifier 262a and a second power amplifier 262b. The output of the first power amplifier 262a is connected to a first RF signal contact 310a on the module substrate 302 via a first wirebond 246a. Similarly, the output of the second power amplifier 262b is connected to a second RF signal contact 310b via a second wirebond 246b. The first and second power amplifiers 262a, 262b may further be connected to other RF circuitry or wiring on the die 200, schematically represented by block 264 in FIG. 6. The RF circuitry or wiring 264 may be connected to one or more RF input/output contacts 304 on the module substrate 302. Although two power amplifiers 262a, 262b are illustrated in FIG. 6, those skilled in the art will appreciate that the RF section 220 may include more or fewer than two power amplifiers, along with other components not shown in FIG. 6.

Adaptive grounding techniques may be applied in the embodiment of FIG. 6, and variations thereof, in a manner similar to that discussed above with reference to FIGS. 3 and 5. For example, in circumstances where one of the two power amplifiers 262a, 262b is operating at a given time and the other is not, the control section grounding path that is located physically further away from the operational power amplifier 262a or 262b can be used. Thus, when the second power amplifier 262b is operating and an RF signal is therefore carried on the second wirebond 246b, which is in proximity to the wirebond 242b of the second grounding path for the control section 210, the second switch 254 can be open and the first switch 252 can be closed (as shown in FIG. 6), such that the grounding wiring 212 is connected via the wirebond 242a to the first analog ground contact 306a on the module substrate 302 thereby providing a grounding path for the control section 210. Any coupling of the RF signal from wirebond 246b into wirebond 242b does not have a connection by which to travel into the control section 210. As discussed above, although wirebond 242a may be in close proximity to wirebond 246a connecting the output of the first power amplifier 262a to the RF signal contact 310a; if the first power amplifier 262a is OFF there is little or no signal coupling between wirebonds 242a and 246a. Similarly, when the first power amplifier 262a is operational and the second power amplifier 262b is OFF, the first switch 252 can be opened and the analog ground connection for the control section 210 can be made by closing the second switch 254.

In circumstances in which both power amplifiers 262a and 262b are operational at the same time, both switches 252, 254 can be closed such that the grounding wiring 212 uses both grounding paths through wirebonds 242a and 242b. Alternatively, a selection can be made as to which switch should be open and which closed. For example, a determination can be made as to the signal strength at the output of each power amplifier 262a, 262b (or at each of the associated RF signal contacts 310a, 310b), and the grounding path closer to the weaker RF signal can be used.

Referring to FIG. 7 there is illustrated another example of a module 300 in which the mixed-signal die 200 includes a power amplifier 262 and a low noise amplifier 266. Such a module 300 may be a transceiver module, for example, that receives RF signals (e.g., from an antenna or switching module) at the input to the low noise amplifier 266 and provides RF signals for transmission (e.g., to an antenna or switching module) from the output of the power amplifier 262. Thus, in one embodiment, the output of the power amplifier 262 is connected to a first RF signal contact 310a on the module substrate 302 via a first wirebond 246a to supply amplified signals for transmission, and a second RF signal contact 310b is connected to the input of the low noise amplifier 266 via a second wirebond 246b to provide received RF signals to the low noise amplifier for amplification. As will be appreciated by those skilled in the art, given the benefit of this disclosure, the power amplifier 262 and low noise amplifier 266 may also be connected to other RF circuity or wiring (not shown) on the mixed-signal die 200. Although the mixed-signal die 200 shown in FIG. 7 includes one power amplifier 262 and one low noise amplifier 266, variations of the mixed-signal die may include one or more power amplifiers and low noise amplifiers. In addition, variations of the module 300 of FIG. 7 may include multiple mixed-signal dies 200, each having one or more power amplifiers and low noise amplifiers to enable transmission and reception of RF signals in multiple frequency bands, for example.

In certain embodiments and applications of a transceiver module 300 such as that shown in FIG. 7, the module may operate in either a transmit mode or a receive mode at any given time. In the transmit mode, the power amplifier 262 is active, and a transmit RF signal may be present on the first wirebond 246a and the associated first RF signal contact 310a, whereas the low noise amplifier 266 may not be receiving any notable RF signal (i.e., there is little or no RF signal power present on the second wirebond 246b and associated second RF signal contact 310b). In contrast, in the receive mode, the low noise amplifier is active, receiving an RF signal from the second RF signal contact 310b via the second wirebond 246b, whereas the power amplifier 262 is turned OFF such that little or no RF signal power is present on the first wirebond 246a and the first RF signal contact 310a. Applying adaptive grounding, during the receive mode, the second switch 254 is open and the analog ground connection for the control section 210 is made by closing the first switch 252, as shown in FIG. 7, to connect the grounding wiring 212 to the wirebond 242a, which is connected to the first ground contact 306a. During transmit mode, the first switch 252 is open, and the second switch 254 is closed to provide a grounding path for the control section 210 via the wirebond 242b and second ground contact 306b. Thus, as discussed above, unwanted signal coupling from either amplifier into the control section 210 can be avoided by selectively connecting the analog grounding path located physically further away from wirebond(s) 246 (or other electrical connectors) carrying RF signals from the active amplifier.

FIGS. 3, 6, and 7 provide particular examples of mixed-signal die and module configurations in which adaptive grounding techniques can be applied. Given the benefit of this disclosure, those skilled in the art will readily recognize that the adaptive grounding techniques can be applied to a many variations of these mixed-signal dies and modules and to a wide variety of RF components, not limited to switches and amplifiers. For example, adaptive grounding techniques can be applied to avoid using a grounding path that is in close physical proximity to electrical connector(s) carrying RF signals to or from the input or output of RF components such as, but not limited to, power amplifiers, low noise amplifiers, switches, attenuators, voltage controlled oscillators, mixers, filters, or directional couplers, so as to mitigate coupling between the RF signals of interest and the parasitic noise or non-linearity of the control section 210. In addition, although the above discussed examples refer primarily to adaptive grounding, similar adaptive signal path selection techniques can be applied to selectively connect the supply (Vss) to the control section 210 via one or more of a plurality of selectable paths to mitigate unwanted signal coupling between the RF section 220 and the control section 210 through the supply connection(s).

The examples shown in FIGS. 2-7 illustrate embodiments in which wirebonds are used to connect the mixed-signal die 200 to contacts or other circuitry on the module 300. However, the adaptive grounding or path selection techniques disclosed herein may be applied equally to address on-chip coupling (inductive or capacitive) in embodiments including dies that are connected by means other than wirebonds, such as by flip-chip bonding using solder bumps and circuit board inductance, for example. In any circumstance where the RF section of a mixed-signal die induces signal into analog or digital control section, the approach disclosed herein can be leveraged.

Figure 8:
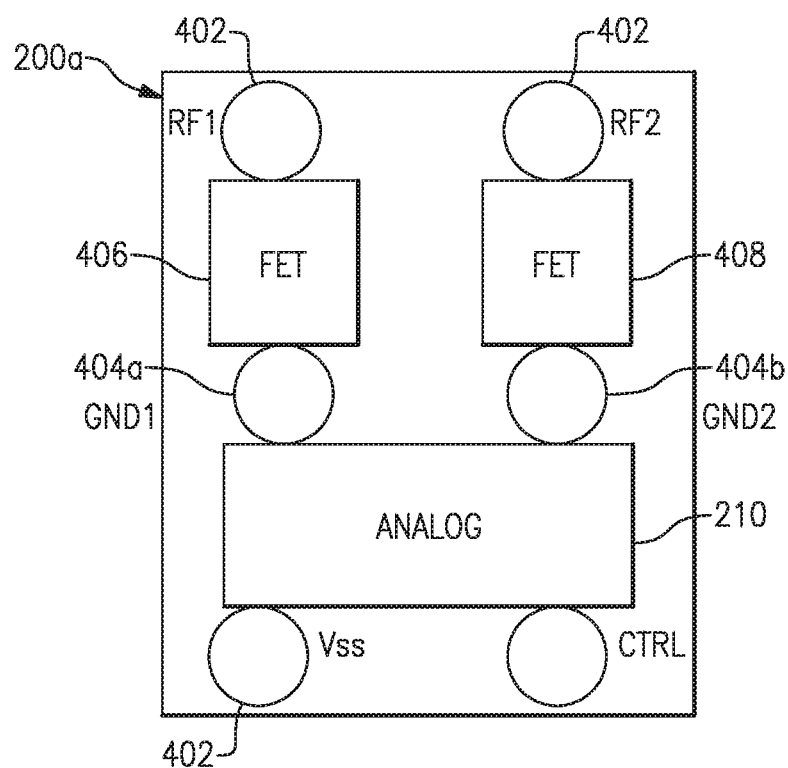
FIG. 8 is a block diagram of another example of a device including adaptive grounding according to aspects of the present invention.

For example, in certain dies the RF ground path may share the same path (e.g., the same bump) as the analog ground. In this case, the adaptive grounding techniques disclosed herein can be used to redirect the analog grounding path through a different RF/analog connection, and thereby reduce or avoid unwanted signal coupling. FIG. 8 illustrates an example of a mixed-signal die 200a that includes a plurality of bumps 402 for connection to a module substrate or other circuitry. As used herein, the term "substrate" may refer not only to a wafer-type substrate, but also to any type of electronic circuit board or platform to which electronic components or devices may be attached. In the example shown in FIG. 8, the GND1 and GND2 bumps 404a and 404b may be connected together and serve as ground for both the RF section 220 and the analog or control section 210. In this case the RF signal from RF1 or RF2 to ground shares the same bump and circuit board inductance as the analog grounding path. Without intervention, this arrangement would result in the RF signals inducing significant AC signals inside the control section 210, as discussed above. Accordingly, a pair of switches 406, 408 can be used to implement adaptive grounding, similar to as described above with reference to FIGS. 2-7. In one embodiment, a first switch 406 can be operated to connect the analog ground to GND1 (bump 404a) when RF2 is active, and conversely, a second switch 408 can be operated to connect the analog ground to GND2 when RF1 is active. In the illustrated example, the first and second switches 406, 408 are FET switches; however, any suitable switch technology can be used.

Thus, aspects and embodiments provide an adaptive grounding or path selection technique that allows dynamic or "on the fly" re-location of a grounding, power, or other signal path for the control section 210 of a mixed-signal die 200 to minimize noise or other interference caused by unwanted signal coupling between the RF section 220 and the control section 210. In particular, by determining which RF signal contacts are active, and controlling two or more switches to selectively connect the control section grounding path physically located farthest from the active RF signal contacts, unwanted inductive coupling of the RF signal(s) into the analog grounding path can be minimized.

Figure 9:
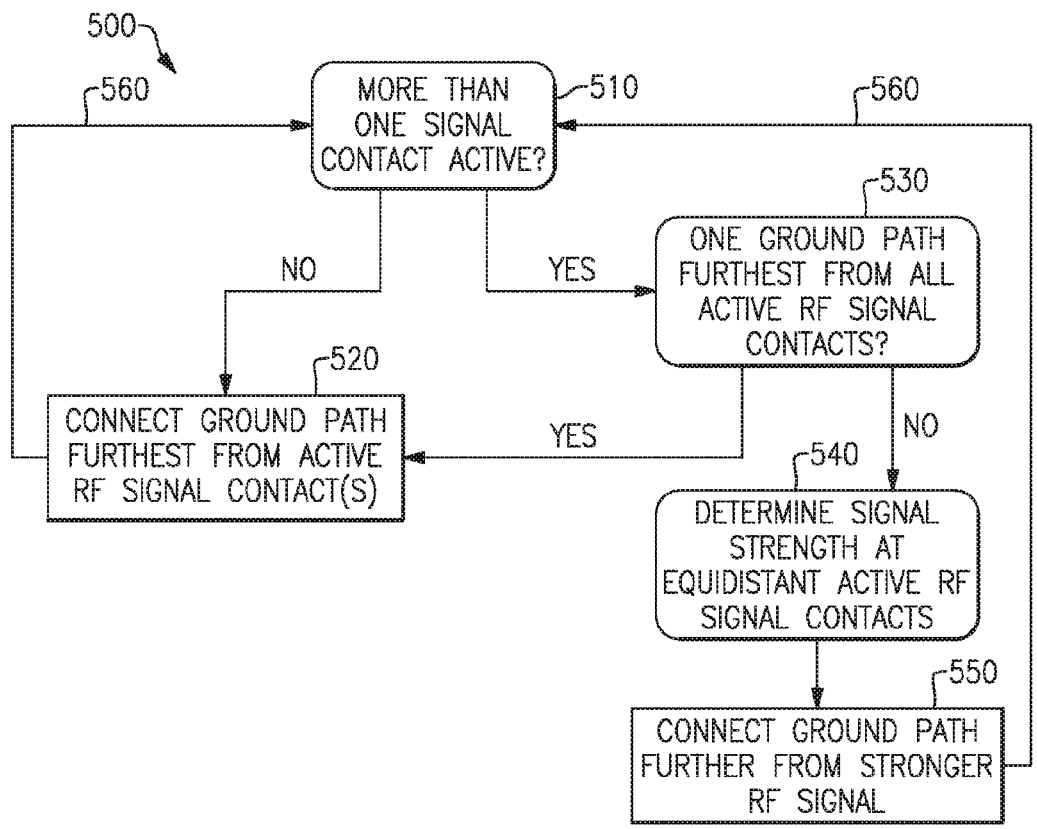
FIG. 9 is a flow diagram illustrating one example of a process of adaptive grounding according to aspects of the present invention.

Referring to FIG. 9, there is illustrated a flow diagram of one example of an adaptive grounding process 500. In one embodiment, the process 500 includes a step 510 of determining whether or not multiple RF signal contacts and associated RF switching circuits are active. If only a single RF contact is active, the grounding path located physically farthest from the active RF signal contact can be connected (step 520). An example of this arrangement is shown in FIG. 5, as discussed above. If multiple RF contacts are active, the process 500 can include a step 530 of determining whether there is a grounding path that is physically located farthest from all the active RF signal contacts. If yes, that grounding path can be connected (step 520). For example, referring to FIGS. 3 and 5, if RF signal contacts RF2 and RF3 are simultaneously active, the grounding path including wirebond 242b and analog ground contact 306b is physically farther from both RF signals contacts RF2 and RF3 than is the grounding path including wirebond 242a and analog ground contact 306a. Accordingly, switch 252 can be opened and switch 254 closed, thereby connecting the grounding path (wirebond 242b and analog ground contact 306b) that is farthest from both the active RF contacts (step 520). Alternatively, as discussed above, in some instances neither grounding path may be physically farther away from both active RF signal contacts than the other. For example, referring to FIGS. 3 and 5, if RF3 and RF4, or RF2 and RF5 are simultaneously active, then the first grounding path (wirebond 242a and analog ground contact 306a) is farther from one active RF signal contact (e.g., RF4 or RF5), but closer to the other active RF signal contact (e.g., RF2 or RF3) than is the second grounding path (wirebond 242b and analog ground contact 306b). In this case, as discussed above, a determination can be made in step 540 as to which active RF signal contact carries the stronger RF signal (therefore likely to induce more unwanted signal coupling), and the grounding path farther from that RF signal contact can be connected (step 550). The process 500 can repeat, as indicated by arrows 560, continuously, at random or periodic intervals, or responsive to a control signal, to dynamically adapt the selected grounding path to changing conditions such as which RF signal contact(s) are active or varying RF signal strength at different contacts.

Figure 10:
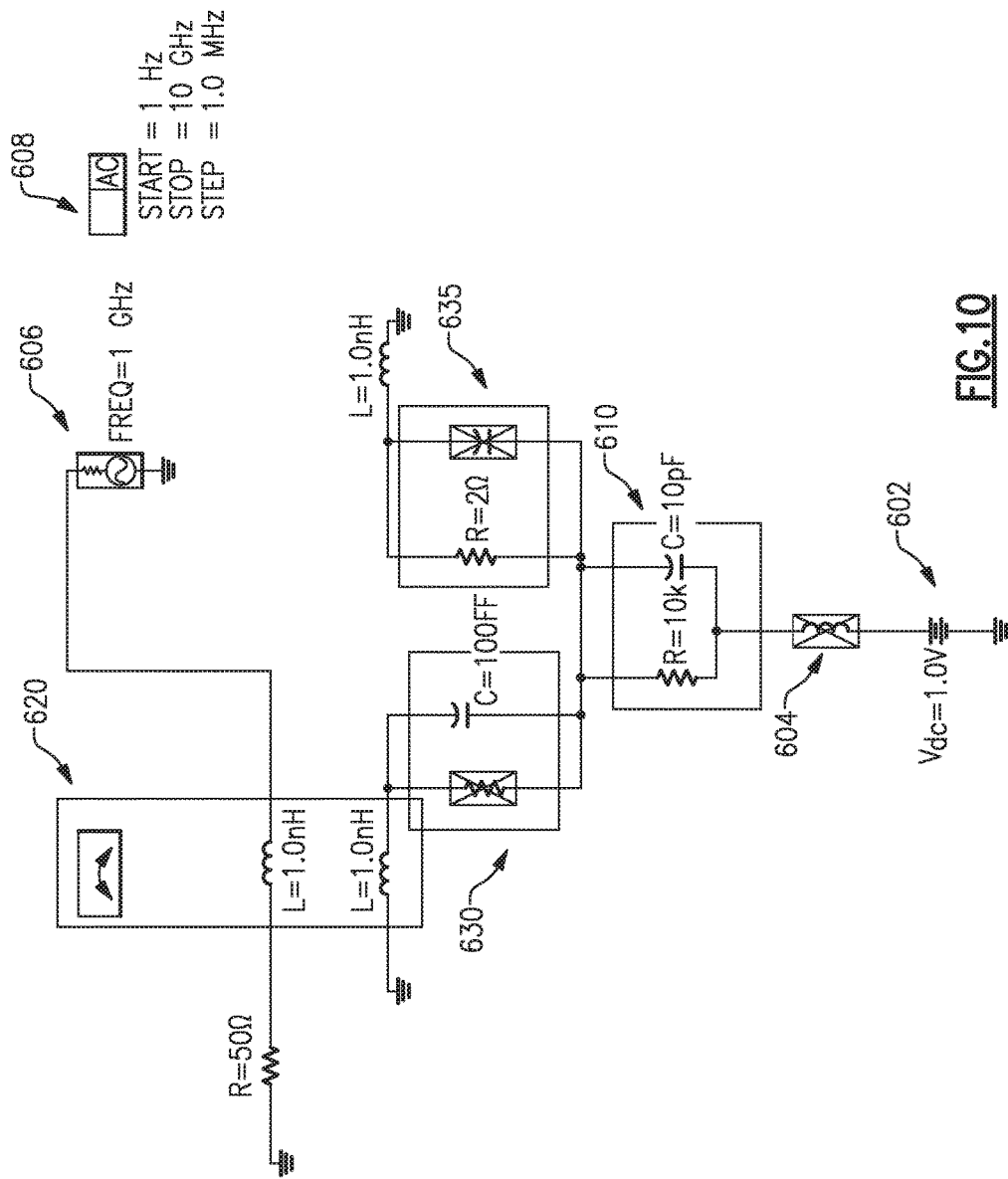
FIG. 10 is an equivalent circuit diagram of a portion of an electronic device used to simulate adaptive grounding techniques according to aspects of the present invention.

Simulations of a mixed-signal RF device with and without adaptive grounding were performed to demonstrate effectiveness of the techniques disclosed herein. FIG. 10 is an equivalent circuit diagram for simulating an example of the adaptive grounding techniques disclosed herein. The simulation circuit includes a model of the analog control section 610, coupled to a Vss connection 602 via a modelled wirebond 604. The simulated circuit further includes a model of an RF switching circuit 620, connected to a modeled RF signal contact/port 606. The simulated circuit further includes two modeled "adaptive grounding" switches 630 and 635. The "R" represents the ON resistance, Ron, of the adaptive grounding switch 630/635 when the switch is the ON condition and the "C" represents the parasitic capacitance, Coff, of the adaptive grounding switch when in the OFF condition. In FIG. 10, the switch 635 is in the ON condition (Ron=2 ohm, C is disabled for simulation) and the switch 630 is in the OFF condition (Ron is disabled and Coff=100 fF is enabled for simulation).

Figure 11A:
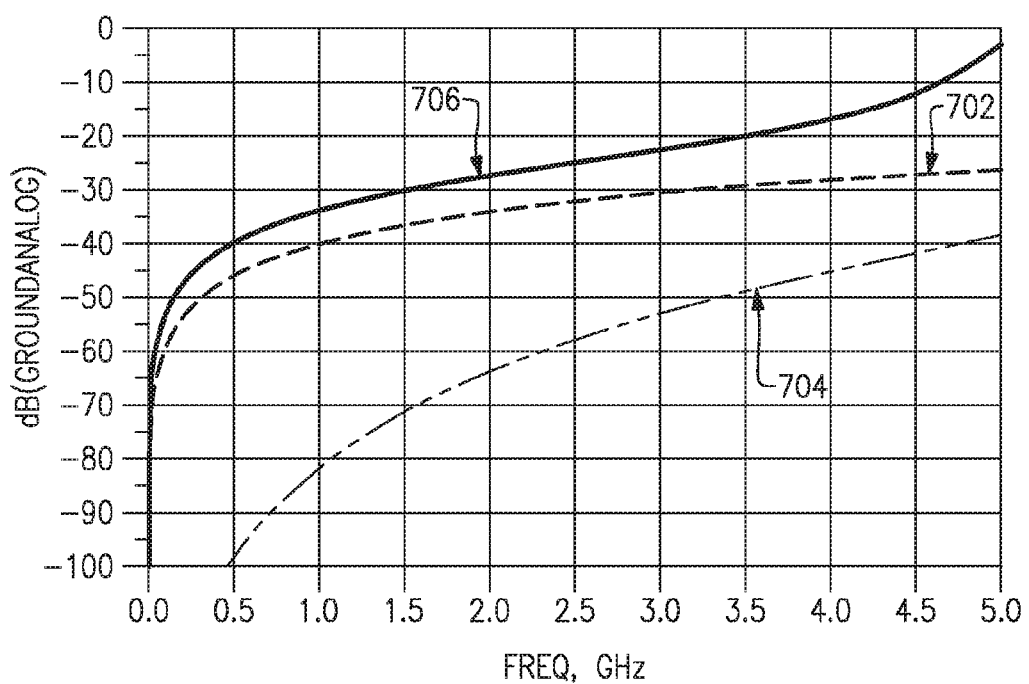
FIG. 11A is a graph showing simulation results obtained from simulations using the equivalent circuit of FIG. 7.
Figure 11B:
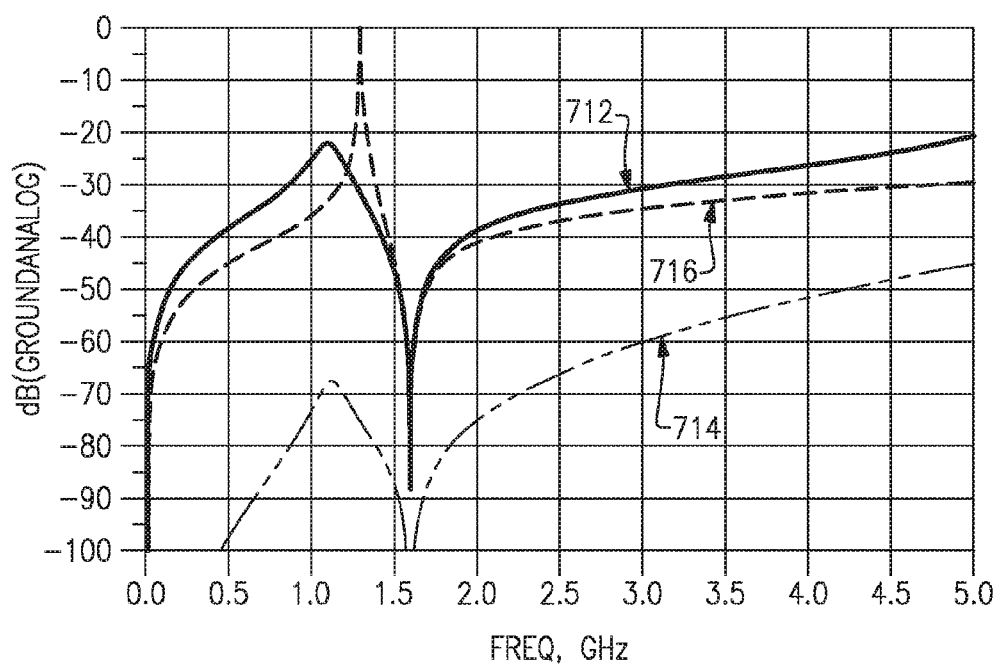
FIG. 11B is a graph showing further simulation results obtained from simulations using the equivalent circuit of FIG. 7.

FIGS. 11A and 11B are graphs showing results of simulations performed using the equivalent circuit shown in FIG. 10. In particular, FIGS. 11A and 11B show noise on the analog ground path (in dB) as a function of frequency (in GHz) for various simulation conditions, as discussed further below. For the simulations, a simulated RF signal was applied at the modeled RF signal contact 606 corresponding to the AC signal source 608 shown in FIG. 10.

The results shown in FIG. 11A correspond to simulations performed without including the Vss connection 602 and modelled wirebond 604. In FIG. 11A, curve 702 corresponds to a "baseline" condition in which both simulated adaptive grounding switches 630 and 635 and associated grounding paths were connected. In other words, this condition corresponds to a conventional arrangement with no adaptive grounding applied. Curve 704 corresponds to an example in which adaptive grounding according to aspects disclosed herein was applied. Specifically, in this simulation, the modeled wirebond near the active RF path was disconnected (corresponding, for example, to the arrangement shown in FIG. 5 and discussed above). Referring to FIG. 10, in this example, the capacitance in the adaptive grounding switch 635 is shown as "inactive" (crossed out) and the resistance is shown as "active," representing the closed switch condition for this path and meaning that this path provides the analog grounding path for the modeled analog control section 610. In contrast, the capacitance in the adaptive grounding switch 630 (near the active modeled RF path) is shown as "active," representing the capacitive coupling that can occur between closely spaced wirebonds or other connections, as discussed above, but the resistance is shown as "inactive," representing the open switch condition for this path. As can be seen by comparing curves 702 and 704, in this example, more than 20 dB additional rejection (reduced noise) can be achieved. In practical applications, this means better harmonics (lower harmonic power), or that the RF signal power can be substantially increased before the analog control section generates harmonics at a level that would negatively impact RF performance of the device. Noise coupling from the analog control section to the RF section (e.g., charge-pump noise or any digital, switching or mixed-signal noise) may also be improved.

Still referring to FIG. 11A, curve 706 represents the condition in which the "wrong" analog grounding path, i.e., the path closer to the active RF signal contact rather than farther from the active RF signal contact, is connected. As can be seen by comparing curves 702 and 706, this situation degrades performance.

Referring to FIG. 11B, the results shown correspond to simulations performed including the Vss connection 602 and modelled wirebond 604. In FIG. 11B, curve 716 corresponds to the baseline condition with no adaptive grounding applied (i.e., both simulated analog grounding paths were connected). Curve 714 corresponds to the example shown in FIG. 10, with correct adaptive grounding applied (i.e., the modeled adaptive grounding switch 635 farther from the modeled active RF contact 606 is active/connected, and the other modeled adaptive grounding switch 630 and associated grounding path closer to the modeled active RF contact 606 is disconnected). Curve 712 corresponds to the opposite condition in which the "wrong" grounding path is connected, as discussed above. As may be seen with reference to FIG. 11B, the resonance created by the various inductors and on-die capacitors when the Vss connection 602 is active similarly affect both the conventional/baseline approach and the circumstance where adaptive grounding is applied. As can be seen by comparing curves 716 and 714, the adaptive grounding approach provides significant improvement over the baseline or conventional approach.

Figure 12:
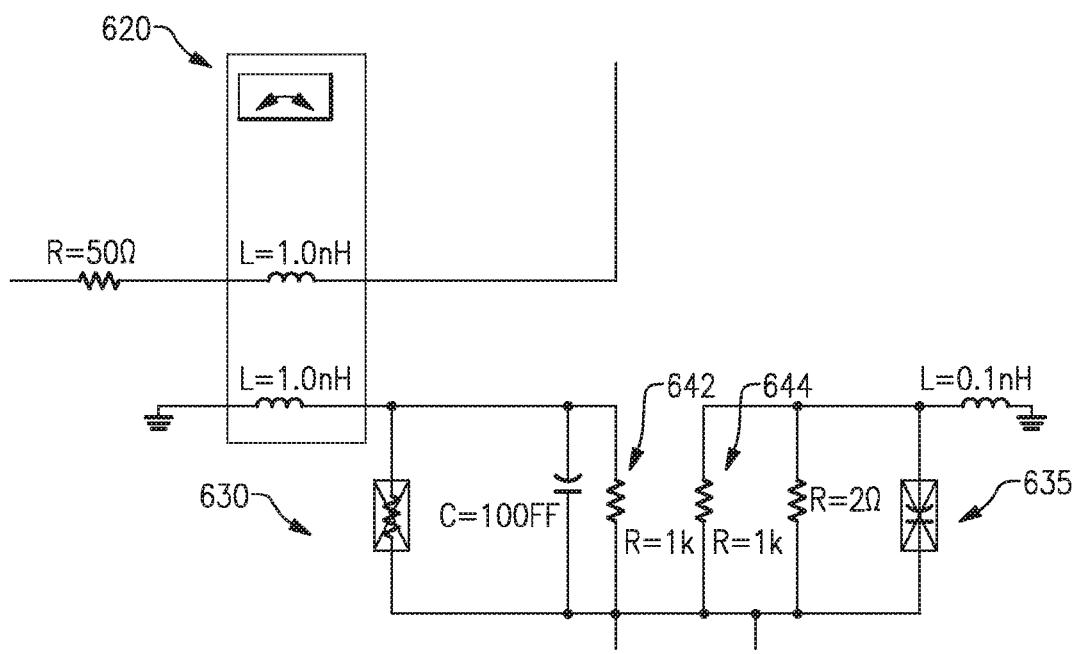
FIG. 12 is another equivalent circuit diagram of a portion of the circuit of FIG. 10 used to simulate adaptive grounding techniques according to aspects of the present invention.

According to another embodiment, a permanent resistive connection can be made between the grounding wiring 212 and analog ground, in addition to one or more switchable grounding paths. This guarantees a DC connection between the grounding wiring 212 and analog ground, even if both switches 252, 254 are open at the same time during transient events. FIG. 12 shows a portion of the simulation circuit of FIG. 10, including a pair of resistors 642, 644 connected between each of the modeled adaptive grounding switches 630, 635 and analog ground.

Figure 13:
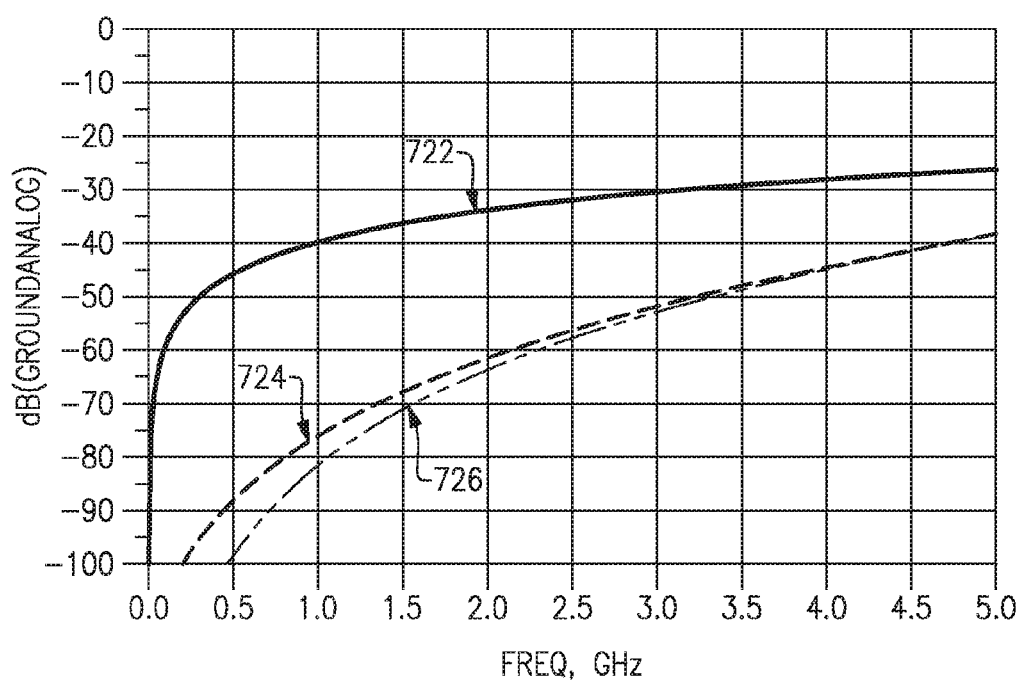
FIG. 13 is a graph showing simulation results obtained from simulations using the equivalent circuit of FIG. 12.

FIG. 13 is a graph showing results of simulations performed using the modified equivalent circuit shown in FIG. 12. In FIG. 13, curve 722 represents the baseline condition with no adaptive grounding applied. Curve 724 corresponds to the example shown in FIG. 12, with correct adaptive grounding applied (i.e., the modeled switchable grounding path 635 farther from the modeled active RF contact 606 is active/connected, and the other modeled switchable grounding path 630 closer to the modeled active RF contact 606 is disconnected) and including the modeled resistors 642 and 644. Curve 726 corresponds to the example shown in FIG. 10, with correct adaptive grounding applied and without the resistors 642 and 644. As shown in FIG. 13, including the resistors 642, 644 causes a slight degradation in performance at lower frequencies; however, the adaptive grounding approach still provides significant improvements over the baseline/conventional approach. Including the resistive path (represented or modeled by resistors 642 and 644) provides the benefit of avoiding a possible floating ground condition if both switchable grounding paths are disconnected at the same time.

Figure 14:
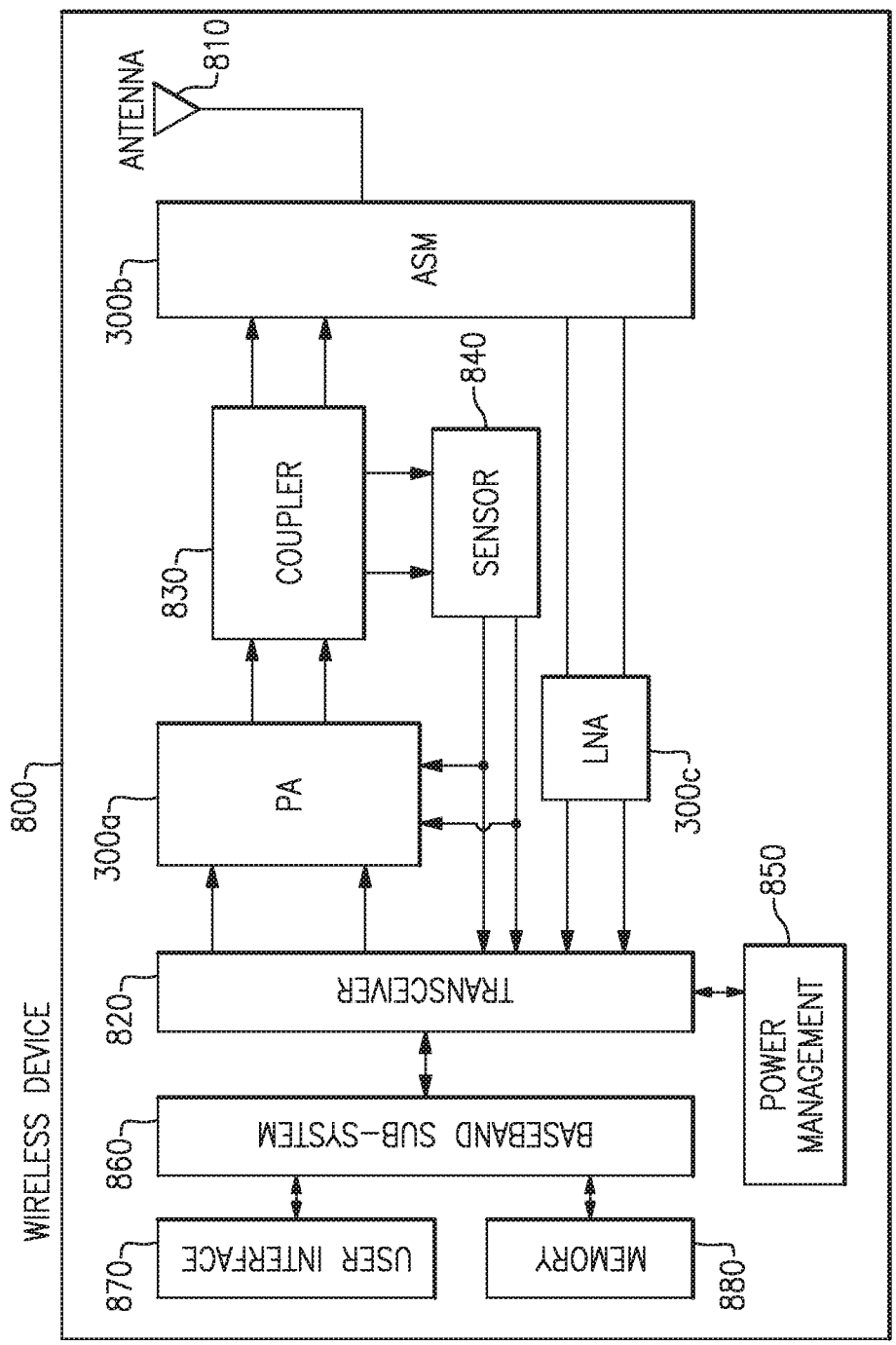
FIG. 14 is a block diagram of one example of a wireless device in which embodiments adaptive grounding can be used according to aspects of the present invention.

As discussed above, embodiments of the mixed-signal die 200 can be packaged, either alone or together with other circuitry, as a module 300 that can be incorporated into an electronic device, such as a mobile communications device, for example. FIG. 14 is a block diagram of one example of a wireless communications device 800 in which embodiments of the module 300 can be used. The wireless device 800 can be a mobile phone, such as a smart phone, for example. By way of example, the wireless device 800 can communicate in accordance with Long Term Evolution (LTE). In this example, the wireless device 800 can be configured to operate at one or more frequency bands defined by an LTE standard. The wireless device 800 can alternatively or additionally be configured to communicate in accordance with one or more other communication standards, including but not limited to one or more of a Wi-Fi standard, a Bluetooth standard, a 3G standard, a 4G standard or an Advanced LTE standard.

As illustrated in FIG. 14, the wireless device 800 can include an antenna 810 and a transceiver 820. The transceiver 820 can generate RF signals for transmission via the antenna 410. Furthermore, the transceiver 820 can receive incoming RF signals from the antenna 810. It will be understood that various functionalities associated with transmitting and receiving of RF signals can be achieved by one or more components that are collectively represented in FIG. 14 as the transceiver 820. For example, a single component can be configured to provide both transmitting and receiving functionalities. In another example, transmitting and receiving functionalities can be provided by separate components.

In one embodiment, the wireless device 800 includes a power amplifier module 300a, which can include adaptive grounding as discussed above with reference to FIG. 6, for example. Signals generated for transmission are received by the power amplifier (PA) module 300a, which amplifies the generated signals from the transceiver 820. As will be appreciated by those skilled in the art, the power amplifier module 300a can include one or more power amplifiers. The power amplifier module 300a can be used to amplify a wide variety of RF or other frequency-band transmission signals. For example, the power amplifier module 300a can receive an enable signal that can be used to pulse the output of the power amplifier to aid in transmitting a wireless local area network (WLAN) signal or any other suitable pulsed signal. The power amplifier module 300a can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 300a and associated components including switches and the like can be fabricated on GaAs substrates using, for example, pHEMT or BiFET transistors, or on a Silicon substrate using CMOS transistors.

In certain embodiments, the wireless device 800 also includes a directional coupler 830 and sensor 840 for measuring the power levels of transmitted signals from the power amplifier module 300a. The sensor 840 can send information to the transceiver 820 and/or directly to the power amplifier module 300a as feedback for making adjustments to regulate the power level of the transmitted signals or gain of the power amplifier module 300a, for example. In certain embodiments in which the wireless device 800 is a mobile phone having a time division multiple access (TDMA) architecture, the directional coupler 830 can advantageously manage the amplification of an RF transmitted power signal from the power amplifier module 300a. In a mobile phone having a time division multiple access (TDMA) architecture, such as those found in Global System for Mobile Communications (GSM), code division multiple access (CDMA), and wideband code division multiple access (W-CDMA) systems, the power amplifier module 300a can be used to shift power envelopes up and down within prescribed limits of power versus time. For instance, a particular mobile phone can be assigned a transmission time slot for a particular frequency channel. In this case the power amplifier module 300a can be employed to aid in regulating the power level one or more RF power signals over time, so as to prevent signal interference from transmission during an assigned receive time slot and to reduce power consumption. In such systems, the directional coupler 830 and sensor 840 can be used to measure the power of a power amplifier output signal to aid in controlling the power amplifier module 300a, as discussed above.

The wireless device 800 can further include an antenna switch module 300b, which can be configured to switch between different bands and/or modes, transmit and receive modes etc. As shown in FIG. 14, in certain embodiments the antenna 810 both receives signals that are provided to the transceiver 820 via the antenna switch module 300b and also transmits signals that are received from the transceiver 820 via antenna switch module 300b. However, in other examples multiple antennas can be used. The antenna switch module 300b can include adaptive grounding, as discussed above. In certain examples the antenna switch module 300b can have a configuration similar to that discussed above with reference to FIG. 3, for example.

In the receive path, the wireless device 800 may include a low noise amplifier (LNA) module 300c, which may include one or more low noise amplifiers configured to amplify the received signals. The low noise amplifier module 300c may also include adaptive grounding as discussed above. In certain examples the low noise amplifier module 300c may have a configuration similar to that discussed above with reference to FIG. 6, only including one or more low noise amplifiers 266 instead of power amplifiers 262. In other examples the power amplifier module 300a and low noise amplifier module 300c can be combined, optionally with some or all of the functionality of the transceiver 820, to provide a module such as that discussed above with reference to FIG. 7.

Still referring to FIG. 14, the wireless device 800 further includes a power management system 850 that is connected to the transceiver 820 and that manages the power for the operation of the wireless device. The power management system 850 can also control the operation of a baseband sub-system 860 and other components of the wireless device 800. The power management system 850 can include, or can be connected to, a battery (not shown) that supplies power for the various components of the wireless device 800. The power management system 850 can further include one or more processors or controllers that can control the transmission of signals and can also configure various components of the wireless device 800. In one embodiment, the baseband sub-system 860 is connected to a user interface 870 to facilitate various input and output of voice and/or data provided to and received from the user. The baseband sub-system 860 can also be connected to non-transient computer readable memory 880 that is configured to store data and/or instructions to facilitate the operation of the wireless device, and/or to provide storage of information for the user.

As will be appreciated by those skilled in the art, implementation shown in FIG. 14 is exemplary and non-limiting. The wireless device 800 can include elements that are not illustrated in FIG. 14 and/or a sub-combination of the illustrated elements. Further, the components of the wireless device 800 can be arranged in a manner different from that shown in FIG. 14. Some of the embodiments described above have provided examples in connection with mobile devices. However, the principles and advantages of the embodiments can be used for any other systems or apparatus, such as any uplink cellular device, that could benefit from any of the circuits described herein. Any of the principles and advantages discussed herein can be implemented in an electronic system that uses mixed-signal dies. Thus, aspects of this disclosure can be implemented in various electronic devices. Examples of the electronic devices can include, but are not limited to, consumer electronic products, parts of the consumer electronic products, electronic test equipment, cellular communications infrastructure such as a base station, a mobile phone such as a smart phone, a telephone, a television, a computer monitor, a computer, a modem, a hand held computer, a laptop computer, a tablet computer, an electronic book reader, a wearable computer such as a smart watch, a personal digital assistant (PDA), an appliance, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a peripheral device, a clock, etc. Further, the electronic devices can include unfinished products.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and it is to be appreciated that embodiments of the methods and apparatuses discussed herein are not limited in application to the details of construction and the arrangement of components set forth in the description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

What is claimed is:

1. A module comprising:
a substrate having disposed thereon a plurality of signal contacts and a ground connection; and
a mixed-signal die disposed on the substrate and including a signal section and a control section, the signal section having a plurality of switching circuits each connected to a respective one of the plurality of signal contacts on the substrate by a corresponding signal connector, and the control section having at least two ground paths that selectively connect the control section to the ground connection on the substrate, the at least two ground paths being physically spaced apart from one another, the mixed-signal die further including at least two switches configured to operate substantially simultaneously and oppositely to one another so as to selectively connect one of the at least two ground paths to the ground connection and disconnect the other of the at least two ground paths from the ground connection.

2. The module of claim 1 wherein each corresponding signal connector includes at least one wirebond.

3. The module of claim 1 wherein each corresponding signal connector includes at least one solder bump.

4. The module of claim 1 wherein the control section is configured to provide control signals to actuate the at least two switches.

5. The module of claim 1 wherein the signal section is a radio frequency signal section, and the signal switching circuits are radio frequency switching circuits each including at least one transistor.

6. A mixed-signal electronic device comprising:
an on-die radio frequency section including first and second radio frequency components and corresponding first and second signal connectors for respectively connecting the first and second radio frequency components to off-die radio frequency circuitry;
an on-die control section coupled to the on-die radio frequency section and including grounding wiring;
a first grounding connector disposed physically closer to the first signal connector than to the second signal connector, the first grounding connector being electrically connected to an off-die ground;
a second grounding connector disposed physically closer to the second signal connector than to the first signal connector, the second grounding connector being electrically connected to the off-die ground;
a first switch operable to selectively connect the grounding wiring of the control section to the first grounding connector; and
a second switch operable to selectively connect the grounding wiring of the control section to the second grounding connector.

7. The mixed-signal electronic device of claim 6 wherein the first and second signal connectors and the first and second grounding connectors are wirebonds.

8. The mixed-signal electronic device of claim 6 wherein the first and second signal connectors and the first and second grounding connectors include solder bumps.

9. The mixed-signal electronic device of claim 6 wherein the first and second switches are configured to be substantially simultaneously and oppositely operable to connect one of the first and second grounding connectors to the grounding wiring at any given time.

10. The mixed-signal electronic device of claim 9 wherein the on-die control section is configured to provide control signals to actuate the first and second switches.

11. The mixed-signal device of claim 6 wherein the first and second radio frequency components are radio frequency switching circuits.

12. The mixed-signal device of claim 6 wherein the first and second radio frequency components are radio frequency amplifiers.

13. A module comprising:
a substrate having disposed thereon a plurality of signal contacts and a ground connection; and
a mixed-signal die disposed on the substrate and including a signal section and a control section, the signal section having a plurality of radio frequency components each connected to a respective one of the plurality of signal contacts on the substrate by a corresponding signal connector, and the control section having at least two ground paths that selectively connect the control section to the ground connection on the substrate, the at least two ground paths being physically spaced apart from one another, the mixed-signal die further including at least two switches configured to operate substantially simultaneously and oppositely to one another so as to selectively connect one of the at least two ground paths to the ground connection and disconnect the other of the at least two ground paths from the ground connection.

14. The module of claim 13 wherein the radio frequency components are radio frequency switching circuits.

15. The module of claim 13 wherein the radio frequency components are radio frequency amplifiers.

16. A method of adaptive grounding in a mixed-signal electronic device including a plurality of radio frequency (RF) components, a control section, and a plurality of grounding connectors, the method comprising:
determining whether more than one of the plurality of RF components is active;
responsive to determining that only one of the plurality of RF components is active, electrically connecting the control section to one grounding connector disposed physically farthest from the active one of the plurality of RF components among the plurality of grounding connectors;
responsive to determining that at least two RF components of the plurality of RF components are active, determining whether the one grounding connector is disposed physically farthest from both of the at least two active RF components; and responsive to determining that the one grounding connector is disposed physically farthest from both of the at least two active RF components, connecting the one grounding connector to the control section.

17. The method of claim 16 wherein the plurality of RF components includes a plurality of RF switching circuits.

18. The method of claim 16 wherein the plurality of RF components includes a plurality of RF amplifiers.

* * * * *